Nov. 30, 1971 D. P. KENNEDY ET AL 3,623,923

JUNCTION TRANSISTOR USING A THIN LAYER OF SEMICONDUCTOR MATERIAL ON A DIFFUSION-PROOF SUBSTRATE

Filed Sept. 3, 1968

INVENTORS
DAVID P. KENNEDY
JOHN A. PERRI
JACOB RISEMAN

BY Sughrue, Rothwell, Mion, Zinn & Macpeak
ATTORNEYS

United States Patent Office 3,623,923
Patented Nov. 30, 1971

3,623,923

JUNCTION TRANSISTOR USING A THIN LAYER OF SEMICONDUCTOR MATERIAL OF A DIFFUSION-PROOF SUBSTRATE

David P. Kennedy, Wappingers Falls, and John A. Perri and Jacob Riseman, Poughkeepsie, N.Y., assignors to International Business Machines Corporation, Armonk, N.Y.

Filed Sept. 3, 1968, Ser. No. 756,806
Int. Cl. B01j *17/00;* H01l *3/00, 7/00*
U.S. Cl. 148—175 2 Claims

ABSTRACT OF THE DISCLOSURE

Planar transistor having reduced junction area for small capacitance. A thin layer of semiconductor material is placed on a substrate material which is a nearly impenetrable barrier against diffusion by normally used impurity atoms. The depth of the junction is limited to approximately the thickness of the thin layer of semiconductor material, thus limiting the junction area and capacitance.

BACKGROUND OF THE INVENTION

Field of the invention

This invention relates to a semiconductor device and a method for making it. More particularly, the semiconductor device is a planar transistor.

DESCRIPTION OF THE PRIOR ART

Transistors have previously been constructed on diffusion resistant elements such as sapphire, as shown by Mueller et al., Proceedings of the IEEE, December 1964, page 1489. However, this reference does not show the use of sapphire as a barrier to diffusion of impurity atoms. It is also known to diffuse alternate regions of one conductivity and then another conductivity in a semiconductor body through an opening in a mask, as shown in U.S. Pat. 3,117,260. However, such diffusions have resulted in large junction areas with correspondingly large capacitances.

SUMMARY OF THE INVENTION

A thin layer of semiconductor material is placed on a diffusion resistant material and covered by a mask having a hole or opening therein. The thin layer is of one conductivity type, for example, P-type material. By successive diffusions of impurity material through the hole in the mask, adjacent regions of opposite conductivity type material are set up, for example, to create a PNP transistor. Because there is negligible diffusion through the diffusion resistant substrate, the junction is limited to the area between the upper surface of the substrate and the upper surface of the thin layer of semiconductor material. By thus controlling the area of the junction, the junction capacitance is also controlled.

DESCRIPTION OF THE PREFERRED EMBODIMENTS

Figure 1:
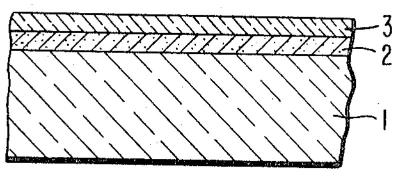
FIG. 1 is a cross-sectional view of a sandwich of material used in the construction of a transistor according to the present invention.

FIG. 1 is a cross-sectional view of a sandwich of material used in the construction of a junction transistor according to the present invention. The transistor will typically to embodied in integrated circuit devices. A substrate 1 is provided of material having a very low electrical conductivity and, in addition, representing an impenetrable (or nearly impenetrable) barrier against the diffusion of impurity atoms normally used for doping semiconductor material. There are numerous materials which could be used for this substrate. Some typical examples of materials which could be used for the substrate are sapphire, SiC, $Si_3N_4$ and $SiO_2$.

A thin layer 2 of semiconductor material is placed on the surface of the substrate material. For the present application, the optimum range of thickness for the semiconductor material is approximately 0.5 to 3.0 microns, although thicknesses outside of this range might also be used. Of course, the semiconductor material must be of suitable crystalline quality for transistor fabrication. There are many techniques well known in the art whereby one can obtain this thin film, for example, by epitaxy, though such techniques have little bearing on the present invention. The thin layer or semiconductor material, as originally applied, is of one conductivity type, for example, P-type material.

Substrate 1 can typically be prepared by depositing a thin insulating layer on the surface of a monocrystalline semiconductor wafer. The insulating layer can be $SiO_2$, SiO, $Si_3N_4$, $AlO_3$, or any other suitable insulating material. The insulating layer can be deposited by any suitable process appropriate for the selected insulating material. For example, $SiO_2$ can be deposited by thermal growth, R.F. sputtering, etc. $Si_3N_4$ can typically be deposited by reactive R.F. sputtering or pyrolytic deposition. A relatively thick layer is then deposited on the surface of the insulating layer, usually on the order of 6 mils to serve as a backing or base. The base layer can be polycrystalline silicon formed by any suitable method. However, any other suitable material can be used. A major portion of the original silicon wafer, i.e., the back side of the afore-described composite substrate, is then removed to reduce the thickness, typically to approximately $2\mu$. This removal can be accomplished by either chemical or mechanical polishing, or a combination thereof, as for example in polishing process described and claimed in commonly assigned application Ser. No. 549,586

A diffusion mask 3 is placed on the upper surface of the thin layer 2. These diffusion masks are well known in the semiconductor construction art.

Figure 2A:
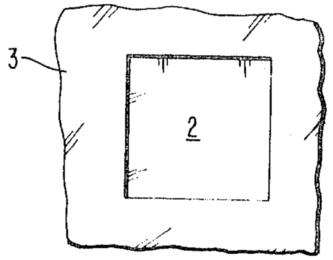
FIGS. 2*a* and 2*b* are top and cross-sectional views of the sandwich of material after a hole has been made in the mask.
Figure 2B:
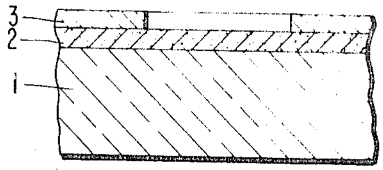

FIGS. 2*a* and 2*b* are top and cross-sectional views of tthe sandwich of material after the next step in the construction of the semiconductor device. A section of the mask 3 is removed using techniques well known in the art, for example, by etching, to expose an area of the thin layer of semiconductor material 2 through the mask 3.

Figure 3A:
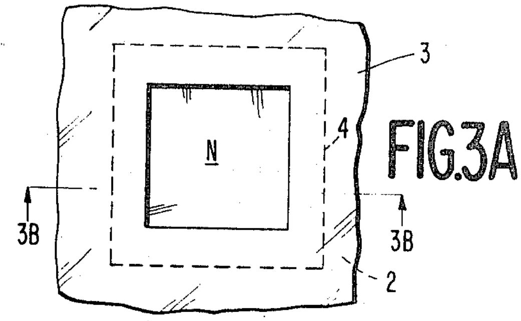
FIGS. 3*a* and 3*b* are top and cross-sectional views of the material after a first diffusion step.
Figure 3B:
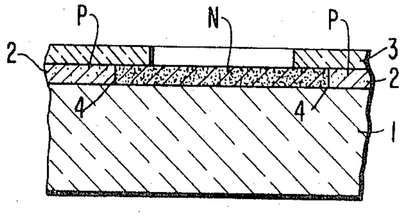

FIGS. 3*a* and 3*b* are top and cross-sectional views of the sandwich of semiconductor material after the next step in the construction of the semiconductor device. For convenience, the semiconductor material in thin layer 2, as originally deposited, will be assumed to be P-type, thereby yielding a PNP transistor. If, instead, this material is N-type, obvious modifications of the fabrication process would yield an NPN transistor.

After the hole is opened in the mask, donor impurity atoms are diffused through the mask opening, using diffusion techniques well known in the semiconductor construction art. This diffusion process is continued for a sufficient time to allow the penetration by the donor atoms over the entire volume of the thin layer of P-type semiconductor film, situated beneath the mask opening and for an additional length of time to yield a PN junction 4 well removed from the diffusion mask opening. As will be discussed later in connection with FIGS. 5*a* and 5*b*, this junction may be approximately perpendicular to the semiconductor surfaces.

Figure 4A:
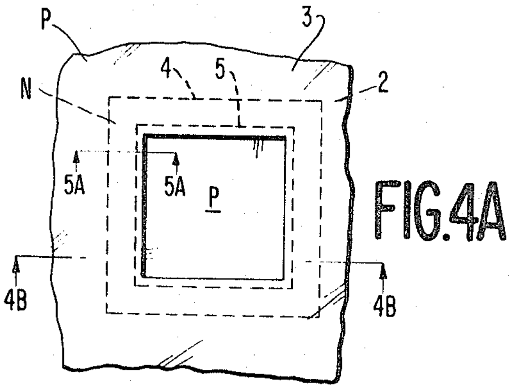
FIGS. 4*a* and 4*b* are top and cross-sectional views of the material after a second diffusion step.
Figure 4B:
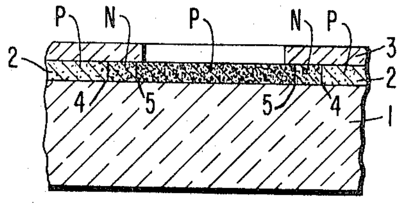

FIGS. 4*a* and 4*b* are top and cross-sectional views of the sandwich of semiconductor material after the next step. Acceptor impurity atoms are diffused through the mask opening into the surface of the thin layer of semiconductor material 2, to produce a second diffused region within the first diffused region. The second diffused region will be of the first conductivity type, for example, P-type and will form a second PN junction 5 with the first diffused region.

Thus, the first junction 4 marks the outer periphery of the first diffused region, and separates the first diffused region from the outer region of the thin layer. The second PN junction 5 marks the inner periphery of the first diffused region, and separates the first diffused region from the second diffused region. The combination of the outer region, the first diffused region, and the second diffused region, produces a PNP semiconductor device, as constructed in the manner just described. Of course, the same technique can be used to produce an NPN semiconductor device through obvious modifications.

The PN junctions 4 and 5 extend from the upper surface of the thin layer of semiconductor material through the semiconductor material to the upper surface of the substrate. Because the substrate is impenetrable, or nearly impenetrable, by the impurity atoms, the junction stops at the surface of the substrate. There is no large junction area directly underneath the mask opening, as is the case with prior art devices. Because the total area in each of the junctions is reduced, the junction capacitance is also reduced.

Figure 5A:
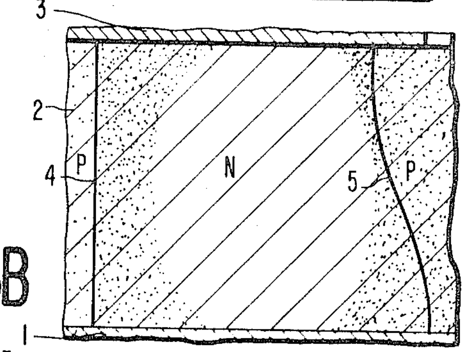
FIGS. 5*a* and 5*b* are cross-sectional views of two of the many possible junction profiles achievable in the present invention.
Figure 5B:
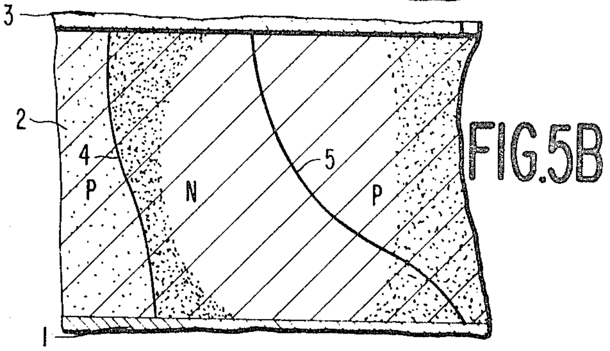

FIGS. 5*a* and 5*b* are cross-sectional representations of two typical junction profiles. The junctions may be nearly perpendicular to the surface of the semiconductor layer, as shown by junction 4 in FIG. 5*a*, or the junctions may be very much non-perpendicular, as shown by junction 5 in FIG. 5*b*. Generally, a junction which extends well beyond the edge of the mask hole is much more nearly perpendicular to the semiconductor surface than a junction which is nearer to the edge of the mask hole.

Figure 6:
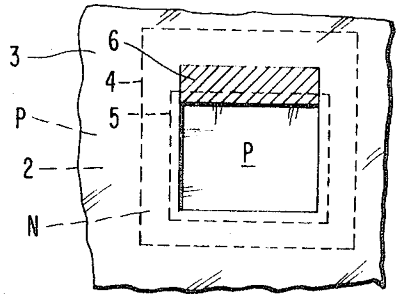
FIG. 6 is a top view of the invention with an additional mask to allow room for emitter contacts.

FIG. 6 illustrates a substitute method of accomplishing the step described in connection with FIGS. 4*a* and 4*b*. It is desirable to have the area between the inner and outer periphery of the first diffusion region large enough to allow an electrical contact to the first diffusion region, which will be the transistor base region. If the area of the first diffusion region will not be large enough, using the method of fabrication just described, an additional diffusion mask 6 can be used after the first diffusion step to close off an area of the mask hole. The additional mask area 6 will close off a larger part of the first diffusion region from diffusion by the second diffusion step. After removing this additional mask, a larger region will be accessible for electrical contact to the transistor base region.

While the invention has been particularly shown and described with reference to preferred embodiments thereof, it will be understood by those skilled in the art that various changes in form and details may be made therein without departing from the spirit and scope of the invention.

What is claimed is:

1. A method of manufacturing a semiconductor device comprising the steps of:

(a) providing a substrate which is substantially impenetrable by diffused impurity atoms with a thin layer of semiconductor material of a first conductivity type on said substrate, (b) placing on said thin layer a mask which is substantially impenetrable by diffused impurity atoms, (c) making a single hole only through said mask to the surface of said thin layer, (d) starting the diffusion of impurity atoms of one kind through said hole to generate in said thin layer a first region containing semiconductor material of a second conductivity type, (e) continuing said diffusion of impurity atoms of one kind for a period of time sufficient to cause said first region to extend to said substrate and beyond the edge of said hole, (f) placing a mask over one part of said hole and causing the diffusion of impurity atoms of the other kind through the other part of said hole to generate in said thin layer a second region containing semiconductor material of said first conductivity type and (g) continuing said diffusion of impurity atoms of the other kind for another period of time sufficient to cause said second region to remain entirely within the perimeter of said first region.

2. A method according to claim 1 wherein the step of providing a substrate further comprises providing said substrate of a material selected from the group consisting of sapphire, SiC, $Si_3N_4$ and $SiO_2$.

References Cited

UNITED STATES PATENTS

| | | | |
|---|---|---|---|
| 2,981,877 | 4/1961 | Noyce | 317—235 |
| 3,308,354 | 3/1967 | Tucker | 317—234 |
| 3,328,214 | 6/1967 | Hugle | 148—175 |
| 3,373,051 | 3/1968 | Chu et al. | 117—106 |
| 3,390,022 | 6/1968 | Fa | 148—33 |
| 3,409,812 | 11/1968 | Zuleeg | 317—235 |
| 3,411,051 | 11/1968 | Kilby | 37—235 |
| 3,424,955 | 1/1969 | Seiter et al. | 317—234 |
| 3,445,927 | 5/1969 | Ullrich et al. | 29—578 |
| 3,455,020 | 7/1969 | Dawson et al. | 148—187 X |
| 3,484,662 | 12/1969 | Hagon | 317—235 |

OTHER REFERENCES

Fa and Jew, "Poly-Silicon Insulated-Gate Field-Effect Transistor," IEEE Trans. on Electron Devices, correspondence, vol. ED–13, No. 12, February 1966, pp. 290–291.

Zuleeg and Knoll, "Thin-Film Lateral Bipolar Transistor in Silicon-on-Sapphire Structure," Electronics Letters, April 1967, vol. 3, No. 4, pp. 137–139.

L. DEWAYNE RUTLEDGE, Primary Examiner

W. G. SABA, Assistant Examiner

U.S. Cl. X.R.

29—578; 117—201, 212; 148—33, 187; 317—101, 235